United States Patent [19]

Hayashi

[11] Patent Number: 5,063,296
[45] Date of Patent: Nov. 5, 1991

[54] ELECTRON-OPTICAL SYSTEM FOR MAKING A PSEUDOPARALLEL MICRO ELECTRON-BEAM

[75] Inventor: Shigeki Hayashi, Kyoto, Japan

[73] Assignee: Shimadzu Corporation, Kyoto, Japan

[21] Appl. No.: 531,362

[22] Filed: May 31, 1990

[51] Int. Cl.$^5$ .......................................... H01J 37/141
[52] U.S. Cl. ................................ 250/396 ML; 250/398
[58] Field of Search ............ 250/396 R, 396 ML, 398

[56] References Cited

U.S. PATENT DOCUMENTS

| | | | |
|---|---|---|---|
| 3,937,958 | 2/1976 | Rusch et al. | 250/307 |
| 4,882,486 | 11/1989 | Kruit | 250/396 ML |
| 4,961,003 | 10/1990 | Yonezawa | 250/396 ML |

*Primary Examiner*—Bruce C. Anderson
*Attorney, Agent, or Firm*—Armstrong, Nikaido, Marmelstein, Kubovcik & Murray

[57] ABSTRACT

An electron-optical system devised so as to generate a pseudoeparallel micro electron-beam converging at a converging angle of $1 \times 10^{-3}$ radian. The system comprises a condenser lens assembly and an asymmetric objective lens whose smaller field gradient side is directed to the condenser lens assembly. In another electron-optical system achieved by modifying the above system, the converging angle of the electron beam is made variable with an additional objective lens inserted between the condenser lens assembly and the asymmetric objective lens. The conversion angle can be varied by varying the conversion powers of both the objective lenses.

2 Claims, 1 Drawing Sheet

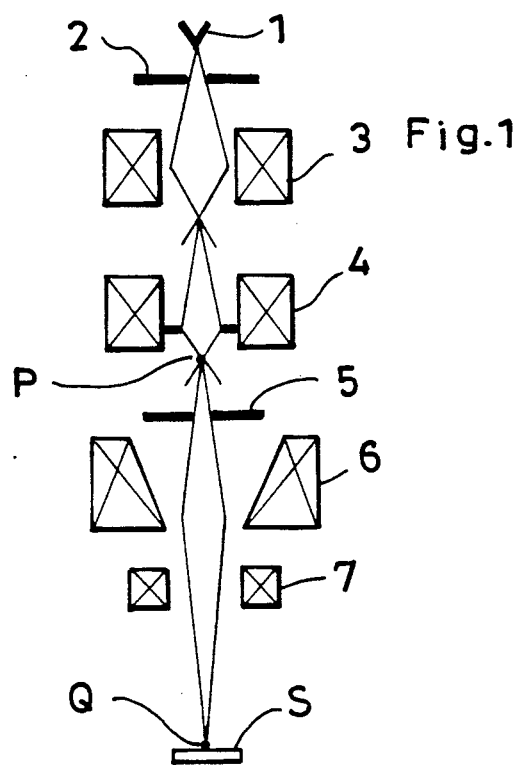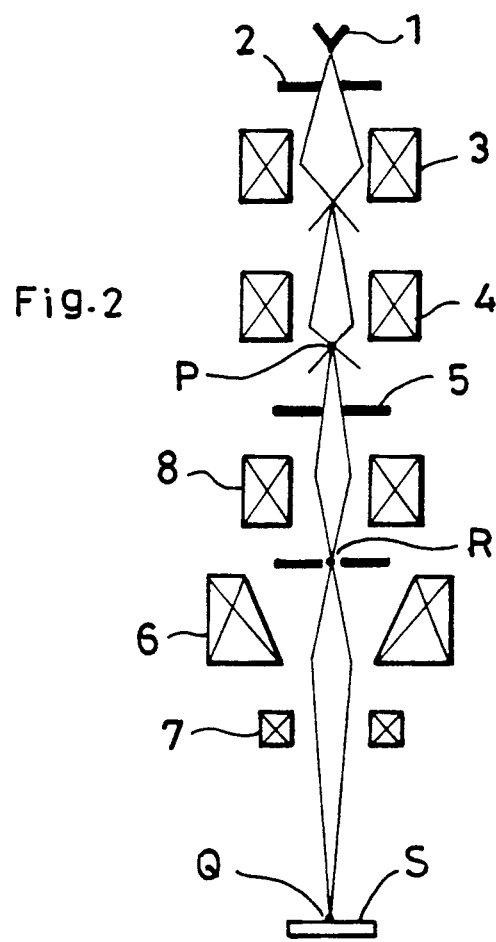

ELECTRON-OPTICAL SYSTEM FOR MAKING A PSEUDOPARALLEL MICRO ELECTRON-BEAM

BACKGROUND OF THE INVENTION

The present invention relates to an electron-optical system for making a substantially parallel micro electron beam.

The electron beam used in a scanning electron microscope (SEM) is made converged to an extremely small point causing the microscope to have a very high resolving power. Converging a beam to so small a point is accompanied, as a matter of course, by a very large beam-converging angle. Therefore, when an object of observation is an uneven-surfaced sample having on its surface many microscopic concaves and convexes, there are some cases where the coned flank of the beam touches the inner side wall or upper edge of some of the concaves, causing it to be impossible to observe stereoscopic micro surface structures of the sample. To overcome such a disadvantage it is desired to obtain a pseudoparallel micro electron-beam having a conversion angle of the order of $10^{-3}$ radian and a beam diameter not larger than 1 $\mu$m. However, it is very difficult to obtain such a pseudoparallel micro electron-beam with a conventional electron-optical system: though such a beam is, in principle, obtained by using electron lenses with a very long focal length, the astigmatism and spherical aberration of a symmetrical electron lens become larger as the lens has its focal length made longer. Under the circumstances it is an urgent matter to create any electron-optical system capable of producing a sharp-focused pseudeoparallel micro electron-beam.

Further, such a system is desired also in some field of electron diffractometry. In analyzing the surface structure of a sample, the conventional electron diffractometers, which use an electron beam with a diameter of the order of a millimeter, can give only the data averaged over an area of the order of millimeter, and does not give information about fine structures contained in a region of the order of micrometer. Such fine structures become capable of being analyzed for the first time with a substantially parallel electron beam having a diameter not larger than the order of a micrometer.

OBJECTS AND SUMMARY OF THE INVENTION

Therefore, the present invention aims at overcoming the previously mentioned difficulties in making a pseudoparallel micro electron-beam, and makes it an object to provide an electron-optical system improved so as to be able to make a micro electron-beam with a converging angle small enough to regard the beam as substantially parallel.

Another object of the present invention is to provide an electron-optical system made by modifying such an improved electron-optical system so that the beam converging angle can be varied.

To achieve the above objects a first embodiment of the present invention consists essentially of an electron beam source, a condenser lens assembly and an asymmetric objective lens with its smaller field gradient side directed to the condenser lens assembly. In a second embodiment of the present invention an additional objective lens is inserted between the condenser lens assembly and the asymmetric objective lens. Incidentally, all of the above mentioned "lenses" are of course "electron lenses", as is the same in the description given hereinafter.

With such constitution of the present invention, the asymmetric objective lens, whose spherical aberration is made small, makes the first embodiment produce an electron beam having a converging angle of about $1 \times 10^{-3}$ radian and a converging spot diameter of 0.1 $\mu$m. In the second embodiment, the converging angle and, therefore, also the converging spot diameter can be changed by adjusting the focal length of the additional objective lens as occasion demands.

The present invention has advantages arising from the following consideration.

Consider a 0.1-nm wavelength electron beam passing through a slit or a pin hole with a diameter of 0.1 $\mu$m. The beam coming out from the pin hole has its diverging angle estimated to be $1 \times 10^{-3}$ radian. Therefore, the converging spot diameter of 0.1 $\mu$m obtained by the first embodiment, which makes a beam having a converging angle as small as $1 \times 10^{-3}$ radian, shows the the smallest limit of spot diameter obtainable from a beam with such a small converging angle. However, it is unpractical or impossible to obtain such a small beam spot by means of a pin hole, not only because it is impossibly difficult to make a pin hole having as small a diameter as 0.1 $\mu$m, but also because the beam thus obtained is very weak. Such a beam is obtained effectively by the present invention, particularly by the above first embodiment. Further, according to the second embodiment, a spot smaller than 0.1 $\mu$m can be obtained by enlarging the beam converging angle through adjusting the focal length of the additional objective lens.

BRIEF DESCRIPTION OF THE DRAWINGS

The present invention is described in further detail in the following on reference to the accompanying drawings, in which:

FIG. 1 schematically shows the constitution of a first embodiment of the present invention; and FIG. 2 schematically shows the constitution of a second embodiment of the present invention.

DETAILED DESCRIPTION OF THE INVENTION

Referring to FIG. 1, which shows the basic constitution of a first embodiment of the present invention, the embodiment consists essentially of thermal electron source filament 1, first aperture 2, a first and a second condenser lenses 3 and 4, a second aperture 5 and an asymmetric objective lens 6. A diverging electron beam emitted from the filament 1 passes through the first aperture 2 and then once converged to a point P above the second aperture 5 by a condenser lens assembly made up of the first and the second condenser lenses 3 and 4. The electron beam once converged at the point P again diverges and proceeds into the asymmetric objective lens 6, with the diverging angle limited by the second aperture 5. The asymmetric objective lens 6, with it smaller field gradient side directed to the second condenser lens 4, focuses the beam at a focal point Q on a sample S. The points P and Q are thus conjugate with each other. Because the smaller field gradient side of the asymmetric objective lense 6 is directed to the second condenser lens 4, or toward the beam diverging point P, the beam converging angle spanned at the focal point Q is made smaller than the beam diverging angle spanned at the point P, resulting in a converging angle of $1 \times 10^{-3}$ radian in this embodiment. A coil 7 is to make the resultant beam scan on the sample S.

According to FIG. 2, which shows the basic constitution of a second embodiment of the present invention, the second embodiment is constituted with the first embodiment additionally provided with an additional objective lens 8, which is inserted between the asymmetric objective lens 6 and the second aperture 5. The beam diverging at the point P is made converged at a point R by the additional objective lens 8 before proceeding into the asymmetric objective lens 6. In this second embodiment both the asymmetric and the additional objective lenses 6 and 8 have their respective beam-converging power made variable independently. With the beam converging power increased on the additional objective lense 8 and decreased on the asymmetric objective lens 6, the resulting beam has its converging angle made increased. With the above converging power relation reversed, the final beam-converging angle is made small.

I claim:

1. An electron-optical system comprising:

a thermal electron source for emitting a diverging electron beam;

a condenser electron-lens assembly for converging said diverging electron beam to a first converging point; and an asymmetric objective electron lens arranged, with its smaller field-gradient side directed to said condenser electron-lens assembly, for producing a micro electron beam having a beam converging angle of the order of $1 \times 10^{-3}$ radian by converging to a final converging point a diverging electron beam proceeding from said first converging point, said micro electron beam giving an electron beam spot with a diameter not larger than 1 μm at said final converging point.

2. An electron-optical system comprising:

a thermal electron source for emitting a diverging electron beam;

a condenser electron-lens assembly for converging said diverging electron beam to a first converging point;

an additional objective electron lens for making a diverging electron beam from said first converging point converge to a second converging point, said additional objective electron lens having a variable beam converging power; and an asymmetric objective electron lens arranged, with its smaller field gradient side directed to said additional objective electron lens, for producing a micro electron beam by converging to a final converging point a diverging electron beam proceeding from said second converging point, said asymmetric objective electron lens having a variable beam converging power;

whereby said micro electron beam has its converging angle and its beam spot diameter at said final converging point made variable through adjustment of the beam converging power at said additional objective electron lens and said asymmetric objective electron lens.

* * * * *